(12) United States Patent
Hahn et al.

(10) Patent No.: US 9,818,483 B2
(45) Date of Patent: Nov. 14, 2017

(54) ROW DECODER AND A MEMORY DEVICE HAVING THE SAME

(71) Applicant: SAMSUNG ELECTRONICS CO., LTD., Suwon-si, Gyeonggi-do (KR)

(72) Inventors: Wook-Ghee Hahn, Hwaseong-si (KR); Chang-Yeon Yu, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/263,724

(22) Filed: Sep. 13, 2016

(65) Prior Publication Data

US 2017/0084335 A1 Mar. 23, 2017

(30) Foreign Application Priority Data

Sep. 22, 2015 (KR) .................... 10-2015-0133880

(51) Int. Cl.
| | | |
|---|---|---|
| *G11C 16/08* | (2006.01) | |
| *G11C 16/24* | (2006.01) | |
| *G11C 8/08* | (2006.01) | |
| *G11C 8/10* | (2006.01) | |
| *G11C 8/12* | (2006.01) | |
| *G11C 16/04* | (2006.01) | |
| *G11C 16/20* | (2006.01) | |

(52) U.S. Cl.
CPC ............ *G11C 16/08* (2013.01); *G11C 8/08* (2013.01); *G11C 8/10* (2013.01); *G11C 8/12* (2013.01); *G11C 16/24* (2013.01); *G11C 16/0483* (2013.01); *G11C 16/20* (2013.01)

(58) Field of Classification Search
CPC .. G11C 16/08; G11C 8/08; G11C 8/10; G11C 8/12; G11C 16/24; G11C 16/0483; G11C 16/20
USPC ........................ 365/185.11, 185.23
See application file for complete search history.

(56) References Cited

U.S. PATENT DOCUMENTS

| | | |
|---|---|---|
| 4,581,548 A | 4/1986 | Young |
| 7,161,837 B2 | 1/2007 | Park |
| 7,515,503 B2 | 4/2009 | Lee et al. |
| 7,821,832 B2 | 10/2010 | Hahn |
| 8,964,499 B2 | 2/2015 | Liang |
| 2014/0347949 A1 | 11/2014 | Koo et al. |

FOREIGN PATENT DOCUMENTS

| | | |
|---|---|---|
| JP | 2000-021178 | 1/2000 |
| KR | 10-0207532 | 4/1999 |
| KR | 10-0247648 | 12/1999 |
| KR | 10-0316180 | 11/2001 |

(Continued)

*Primary Examiner* — Ly D Pham
(74) *Attorney, Agent, or Firm* — F. Chau & Associates, LLC

(57) ABSTRACT

A row decoder of the semiconductor memory device includes a decoding and precharging unit that is connected between a high voltage node and a block word line, wherein the decoding and precharging unit precharges the block word line, and wherein the decoding and precharging unit includes one or more decoding transistors that decode an address and form a transmission path for transmitting a block selection voltage. The row decoder further includes a pass transistor block that transmits one or more row driving voltages to row lines in response to the block selection voltage, wherein the block selection voltage is boosted according to a switching operation of the pass transistor block.

14 Claims, 11 Drawing Sheets

(56) References Cited

FOREIGN PATENT DOCUMENTS

| KR | 10-0624302 | 9/2006 |
| KR | 10-0710807 | 4/2007 |
| KR | 10-1026268 | 3/2011 |
| KR | 10-1361131 | 2/2014 |
| KR | 1020140139265 | 12/2014 |

ROW DECODER AND A MEMORY DEVICE HAVING THE SAME

CROSS-REFERENCE TO RELATED APPLICATION

This application claims priority under 35 U.S.C. §119 to Korean Patent Application No. 10-2015-0133880, filed on Sep. 22, 2015, in the Korean Intellectual Property Office, the disclosure of which is incorporated by reference herein in its entirety.

TECHNICAL FIELD

The inventive concept relates to a row decoder, and more particularly, to a row decoder with a reduced size and a memory device including the same.

DISCUSSION OF RELATED ART

Semiconductor memory devices may be classified as volatile semiconductor memory devices or non-volatile semiconductor memory devices. Non-volatile semiconductor memory devices can retain their data in the absence of power, while volatile semiconductor memory devices cannot. Examples of non-volatile semiconductor memory devices may include flash memory devices, and resistive memory devices, such as resistive random-access memory (ReRAM), phase change RAM (PRAM), and magnetoresistive RAM (MRAM).

When a semiconductor memory device is driven, for a program operation or an erase operation, a high voltage that is greater than a power voltage may be used. For example, a row decoder with a high voltage transistor may be used to switch a high voltage, or a level shifter may be used to apply a high voltage in the row decoder. However, in these cases, a size of the row decoder is increased.

SUMMARY

According to an exemplary embodiment of the inventive concept, there is provided a row decoder of a semiconductor memory device, the row decoder including a decoding and precharging unit that is connected between a high voltage node and a block word line, wherein the decoding and precharging unit precharges the block word line, and wherein the decoding and precharging unit includes one or more decoding transistors that decode an address and form a transmission path for transmitting a block selection voltage, and a pass transistor block that transmits one or more row driving voltages to row lines in response to the block selection voltage, wherein the block selection voltage is boosted according to a switching operation of the pass transistor block.

The one or more decoding transistors may be turned on in response to an address indicating a selection of a cell block.

Each of the one or more decoding transistors may include a high voltage n-type metal oxide semiconductor (NMOS) transistor.

The pass transistor block may include one or more pass transistors that are switched in response to the block selection voltage.

The one or more row driving voltages may include at least one of a string selection voltage, a word line voltage, and a ground selection voltage, and the block selection voltage may be boosted according to an increase or a decrease of at least one of the string selection voltage, the word line voltage, and the ground selection voltage.

The one or more decoding transistors may include first to $N^{th}$ decoding transistors connected in series between the high voltage and the block word line, where N is an integer equal to or greater than 2, and N bits of an address may be provided to gates of the first to $N^{th}$ decoding transistors, wherein the address is related to a selection of a cell block.

The decoding and precharging unit further includes a high voltage depletion mode transistor, which is connected between the $N^{th}$ decoding transistor and the block word line.

The row decoder may further include a maintaining unit including a latch connected to the block word line, wherein the maintaining unit includes a high voltage transistor connected between the latch and the block word line.

The decoding and precharging unit may not use a high voltage p-type metal oxide semiconductor (PMOS) transistor to precharge the block word line.

According to an exemplary embodiment of the inventive concept, there is provided a semiconductor memory device including a memory cell array including a plurality of cell blocks, and a first row decoder arranged in correspondence with a first cell block, wherein the first row decoder includes a first high voltage transistor area connected between a high voltage node and a block word line, and the first high voltage transistor area includes a decoding and precharging unit including one or more decoding transistors that decode an address and form a path for transmitting a block selection voltage to the block word line.

The first row decoder may further include a second high voltage transistor area connected to the block word line, and the second high voltage transistor area may include a pass transistor block that is switched in response to the block selection voltage, wherein the pass transistor block transmits one or more row driving voltages to row lines when it is switched.

The block selection voltage transmitted to the block word line may be boosted according to the switching of the pass transistor block.

The semiconductor memory device may further include a maintaining unit including a latch connected to the block word line, wherein the maintaining unit includes a high voltage transistor connected between the latch and the block word line.

A second row decoder may be arranged in correspondence with a second cell block.

The semiconductor memory device may include a flash memory device, the memory cell array may include a three-dimensional memory array, the three-dimensional memory array may include a plurality of cell strings that are perpendicular to a substrate, and a memory cell of the plurality of cell strings includes a charge trap layer.

According to an exemplary embodiment of the inventive concept, there is provided a row decoder including: a first circuit including a plurality of transistors disposed between a high voltage node and a block word line, wherein the plurality of transistors decode an address and form a path for a block selection voltage; and a second circuit connected to the first circuit via the block word line, wherein the second circuit transmits at least one row driving voltage in response to the block selection voltage.

The plurality of transistors may be connected in series between the high voltage node and the block word line.

A high voltage provided to the high voltage node may have a drop of a voltage of a first level by passing through the plurality of transistors.

The high voltage dropped by the voltage of the first level may precharge the block word line.

The block selection voltage may be increased when transistors of the second circuit are turned on to provide the row driving voltages.

BRIEF DESCRIPTION OF THE DRAWINGS

The above and other features of the inventive concept will become more clearly understood by describing in detail exemplary embodiments thereof with reference to the accompanying drawings in which.

DETAILED DESCRIPTION OF THE EMBODIMENTS

Figure 1:
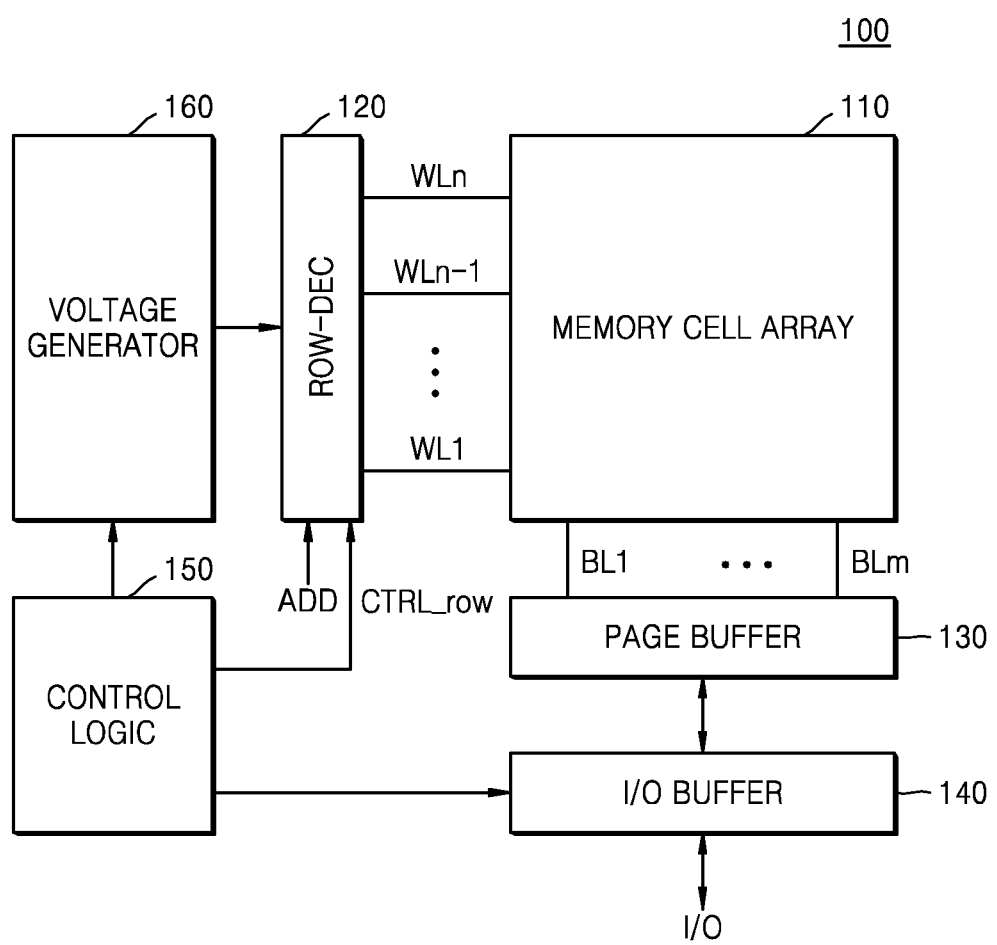
FIG. 1 is a block diagram of a memory device according to an exemplary embodiment of the inventive concept.

Hereinafter, exemplary embodiments of the inventive concept will be described more fully with reference to the accompanying drawings. The inventive concept may, however, be embodied in different forms and should not be construed as limited to the embodiments set forth herein. Like reference numerals in the drawings may denote like elements, and a repeated explanation may not be given for overlapping features. In the attached drawings, sizes of structures may be exaggerated for clarity. All elements shown in the drawings, e.g., units, blocks, etc., may be composed of circuits.

As used herein, the singular forms "a," "an," and "the," are intended to include the plural forms as well, unless the context clearly indicates otherwise.

FIG. 1 is a block diagram of a memory device 100 according to an exemplary embodiment of the inventive concept.

Referring to FIG. 1, the memory device 100 may include a memory cell array 110, a row decoder 120, a page buffer 130, an input/output buffer 140, a control logic 150, and a voltage generator 160. According to an exemplary embodiment of the inventive concept, the memory device 100 may be a volatile memory device, such as a dynamic random-access memory (DRAM) and static random-access memory (SRAM). In addition, the memory device 100 may be a non-volatile memory device, such as a flash memory device, a magnetoresistive random-access memory (MRAM), a resistive random-access memory (ReRAM), and a ferroelectric random-access memory (FRAM). According to an exemplary embodiment of the inventive concept, the memory device 100 may include various memory devices including a row decoder for driving row lines including a word line.

The memory cell array 110 may be connected to the row decoder 120 via word lines WL1 to WLn. In addition, the memory cell array 110 may be connected to the page buffer 130 via bit lines BL0 to BLm. The page buffer 130 may operate as a write driver or a sense amplifier according to an operation mode. For example, during a program operation, the page buffer 130 may transfer a voltage corresponding to data to be programmed, to the bit lines BL0 to BLm. In addition, during a read operation, the page buffer 130 may sense data stored in a selected memory cell via the bit lines BL0 to BLm and transmit the sensed data to the input/output buffer 140. The input/output buffer 140 may transmit the data that is input from the outside to the page buffer 130, or may output data provided from the page buffer 130 to the outside.

The control logic 150 may control various components included in the memory device 100. For example, the control logic 150 may generate internal control signals according to a command of a program/read operation, etc. from the outside. For example, the control logic 150 may control the voltage generator 160 such that voltages of various levels used in the program/read operation, etc. are generated. In addition, the control logic 150 may control timing of an input and an output of data by controlling the input/output buffer 140. In addition, according to an exemplary embodiment of the inventive concept, the control logic 150 may generate a control signal CTRL_row for controlling the row decoder 120. The row decoder 120 may perform a selection operation with respect to a cell block and a word line of the memory cell array 110, based on the control signal CTRL_row.

Hereinafter, an example of an operation of the memory device 100 will be described for the case that the memory device 100 is a non-volatile memory device.

The voltage generator 160 may generate various types of word line voltages and a bulk voltage under control of the control logic 150. The word line voltages are to be supplied to the word lines WL1 to WLn and the bulk voltage is to be supplied to a bulk (for example, a well area) in which memory cells are formed. For example, with respect to a program operation, the voltage generator 160 may generate a program voltage to be provided to a selection word line and a pass voltage to be provided to a non-selection word line. In addition, with respect to a read operation, the voltage generator 160 may generate a selection word line voltage and a non-selection word line voltage having different levels. In addition, the voltage generator 160 may provide an erase voltage of a high level to a bulk in which a memory cell array, which is selected during an erase operation, is formed.

A high voltage may be used for the memory operations described above. For example, the voltage generator 160 may provide a high voltage that is used for a program or an erase operation in the memory cell array 110. For example, the voltage generator 160 may boost a voltage from the outside to generate and provide a high voltage.

The memory cell array 110 may include a plurality of cell blocks. FIG. 1 illustrates one memory cell array 110 and one row decoder 120. However, this is for convenience of explanation, and one row decoder may be arranged in one cell block. In addition, in the memory device 100, one row decoder may be shared by at least two cell blocks, and the number of row decoders may be smaller than the number of cell blocks.

The row decoder 120 may perform an operation related to a selection of a corresponding cell block. For example, when a cell block is selected, word lines voltages are provided to the word lines WL1 to WLn of the selected cell block, and when a cell block is non-selected, word line voltages are prevented from being provided to the word lines WL1 to WLn of the non-selected cell block. To this end, the row decoder 120 may include a block selection unit having a plurality of switches (e.g., a pass transistor), and via switching operations of the switches, transmission of the word line voltages may be controlled.

In addition, with respect to the block selection operation described above, the row decoder 120 may include a decoding area for decoding an address ADD, and a transmission area for transmitting a block selection voltage for controlling the pass transistor. The address ADD may be at least some bits of a row address having a plurality of bits. According to an exemplary embodiment of the inventive concept, the decoding area for decoding the address ADD and the transmission area having a path for transmitting the block selection voltage may be in the same area. For example, a decoding device for decoding the address ADD may be arranged on the path for transmitting a high voltage as the block selection voltage. Based on a result of decoding the address ADD, a transmission path of the block selection voltage via the decoding device may be generated or blocked.

In addition, when a high voltage is transmitted via the decoding device, a voltage drop occurs, and thus, a level of the block selection voltage may be decreased by a predetermined level. According to an exemplary embodiment of the inventive concept, the block selection voltage may be boosted to maintain a high voltage level that is equal to or higher than a predetermined level. For example, the block selection voltage may be provided to a gate of pass transistors switching the word line voltages, and when a voltage level of an electrode (for example, a drain electrode or a source electrode) of the pass transistors is increased when the pass transistors are turned on, the block selection voltage connected to the gate of the pass transistors may be boosted.

According to an exemplary embodiment of the inventive concept, a high voltage p-type metal oxide semiconductor (PMOS) transistor, which is used to reduce a drop of a voltage level of the block selection voltage that is provided to the block word line, may be removed from the row decoder 120. In other words, there is no need to apply a well of a large size for forming the high voltage PMOS transistor, and thus, a size of the row decoder 120 may be reduced.

According to an exemplary embodiment of the inventive concept, the memory device 100 may be a flash memory device. Accordingly, the memory cell array 110 may include a plurality of NAND cell strings. Each cell string may form a channel in a vertical or horizontal direction. Memory cells included in each cell string may be programmed or erased via a high voltage provided from the row decoder 120.

In addition, the memory cell array 110 may be connected to the row decoder 120 via other lines, in addition to the word lines WL1 to WLn. For example, the row decoder 120 may be connected to the row decoder 120 via one or more string selection lines SSL and one or more ground selection lines GSL. Here, the string selection lines SSL, the word lines WL1 to WLn, and the ground selection lines GSL may be referred to as row lines. In addition, a voltage provided to the row lines may be referred to as a row driving voltage.

Figure 2:
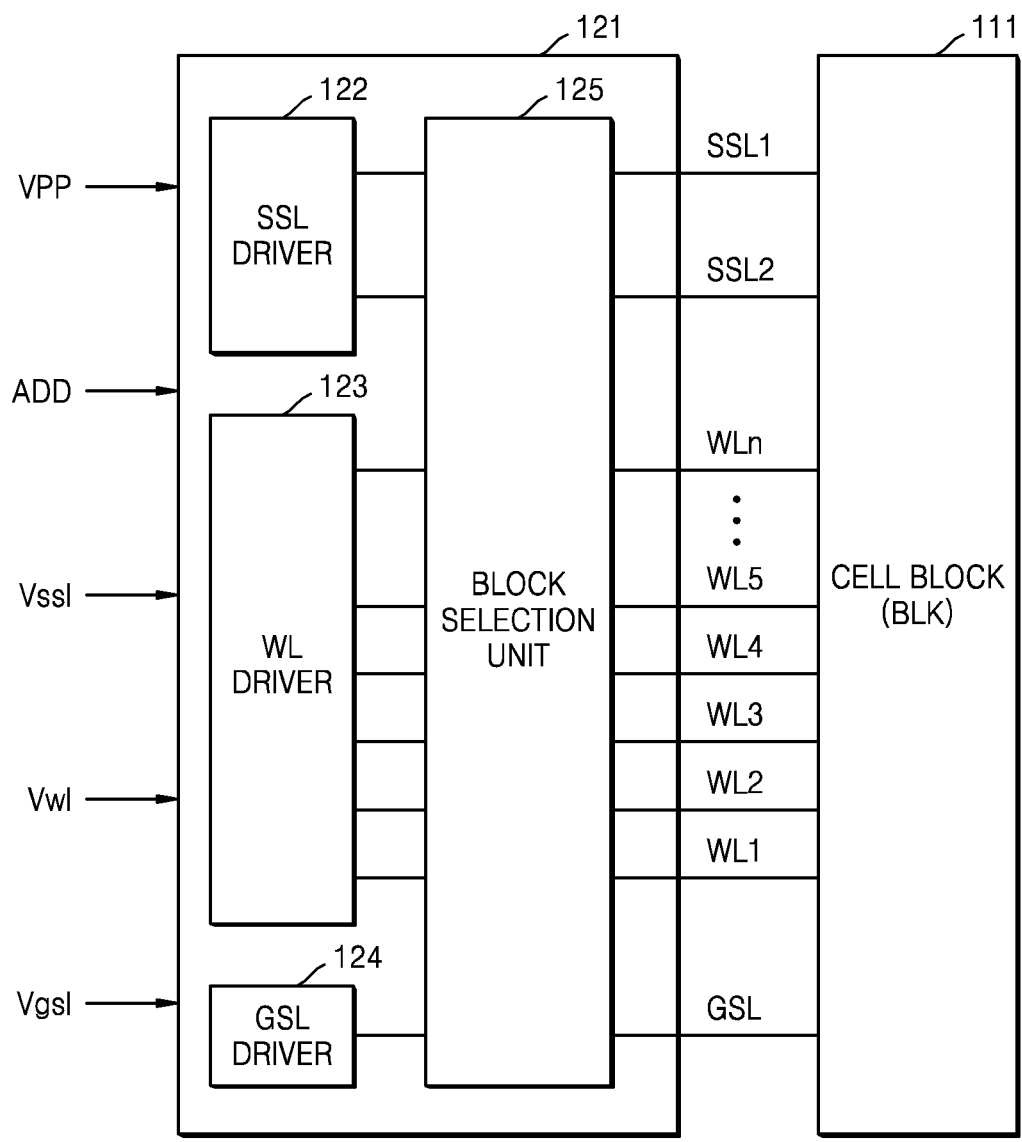
FIG. 2 is a block diagram of a row decoder of FIG. 1 according to an exemplary embodiment of the inventive concept.

FIG. 2 is a block diagram of the row decoder 120 of FIG. 1 according to an exemplary embodiment of the inventive concept. FIG. 2 illustrates an example in which the memory device 100 of FIG. 1 is a flash memory device, and row decoder 121 drives flash memory cells of the flash memory device. In addition, a cell block BLK 111 illustrated in FIG. 2 may be any one of a plurality of cell blocks included in the memory cell array 110 of FIG. 1. In addition, the row decoder 121 may correspond to some components of the row decoder 120 of FIG. 1. In addition, FIG. 2 illustrates that two string selection lines SSL1 and SSL2 and one ground selection line GSL are arranged. However, according to an exemplary embodiment of the inventive concept, the number of string selection lines and the number of ground selection lines may vary.

Referring to FIG. 2, the row decoder 121 may include a string selection line driving unit 122, a word line driving unit 123, a ground selection line driving unit 124, and a block selection unit 125. The block selection unit 125 may decode at least some bits of an address ADD and select a corresponding cell block. For example, the block selection unit 125 may be arranged between the cell block 111, and the string selection line driving unit 122, the word line driving unit 123, and the ground selection line driving unit 124.

The string selection line driving unit 122 is connected to the string selection lines SSL1 and SSL2 via the block selection unit 125. In other words, the string selection line driving unit 122 may drive the string selection lines SSL1 and SSL2 via the block selection unit 125. For example, during an erase operation, the string selection line driving unit 122 may float the string selection lines SSL1 and SSL2, and during a program operation, the string selection line driving unit 122 may provide a high level string selection voltage (for example, a power voltage) to the string selection lines SSL1 and SSL2.

The word line driving unit 123 is connected to the word lines WL1 to WLn via the block selection unit 125. In other words, the word line driving unit 123 may drive the word lines WL1 to WLn via the block selection unit 125. For example, during an erase operation, an erase voltage having a high level may be applied to a bulk in which the cell block 111 is formed, and the word line driving unit 123 may apply a word line voltage (for example, a ground voltage) which is lower than the erase voltage, to the word lines WL1 to WLn. In addition, during a program operation, the word line driving unit 123 may provide a program voltage having a high level to a selection word line, and may provide a pass voltage to a non-selection word line.

The ground selection line driving unit 124 may drive the ground selection line GSL via the block selection unit 125. For example, during an erase operation, the ground selection line driving unit 124 may float the ground selection line GSL, and during a program operation, the ground selection line driving unit 124 may provide a ground selection voltage (for example, a ground voltage) having a low level to the ground selection line GSL.

The block selection unit 125 may include a plurality of pass transistors connected between the string selection line driving unit 122, the word line driving unit 123, and the ground selection line driving unit 124, and the row lines SSL1, SSL2, WL1 to WLn, and GSL. In addition, a gate of each of the plurality of pass transistors may be connected to a block word line, to which a block selection voltage for controlling a block selection is transmitted. In addition, each of the plurality of pass transistors may be a high voltage transistor that is switched in response to the block selection voltage having a high level. In addition, the block selection unit 125 may further include a plurality of decoding transistors for decoding an address ADD, to select the cell block 111. According to an exemplary embodiment of the inventive concept, the plurality of decoding transistors may be used as a transmission path for transmitting the block selection voltage.

For example, the plurality of decoding transistors may be changed to a switching state depending on a bit value of the address ADD. When the cell block 111 is selected, all of the plurality of decoding transistors may be turned on according to a result of decoding the address ADD. Accordingly, a high voltage VPP connected to the plurality of decoding transistors is provided to the block word line via the decoding transistors. According to this operation, the block selection voltage may be precharged in the block word line, and the precharged block selection voltage may be provided to the gate of the pass transistors.

When the cell block 111 is non-selected, at least one of the plurality of decoding transistors is turned off, and thus, the transmission path of the block selection voltage via the decoding transistors is blocked.

Figure 3:
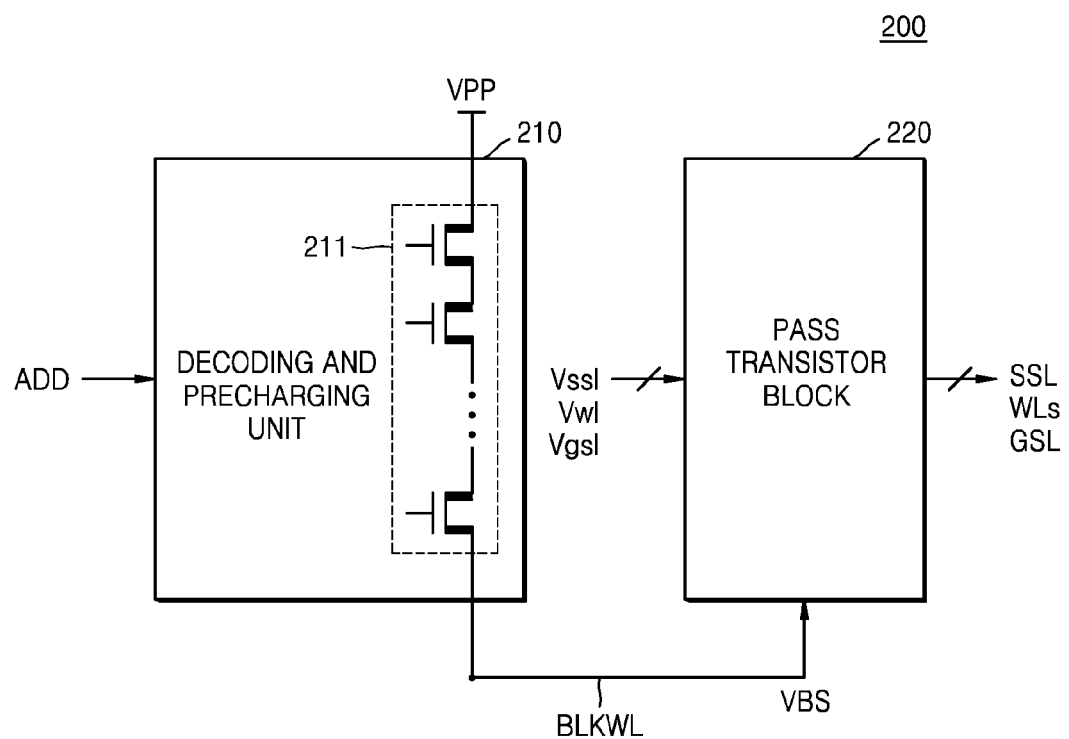
FIG. 3 is a block diagram of a row decoder according to an exemplary embodiment of the inventive concept.

FIG. 3 is a block diagram of a row decoder 200 according to an exemplary embodiment of the inventive concept. For convenience of explanation, FIG. 3 illustrates components of the row decoder 200 that are related to a selection of a cell block. For example, the components illustrated in FIG. 3 may be included in the block selection unit 125 of FIG. 2.

Referring to FIG. 3, the row decoder 200 may include a decoding and precharging unit 210 and a pass transistor block 220. The decoding and precharging unit 210 may include a high voltage transistor area 211 connected between a high voltage VPP and a block word line BLKWL. In other words, the high voltage transistor area 211 is connected to a node, to which the high voltage VPP is applied. The high voltage transistor area 211 may include a plurality of decoding transistors connected in series. Each of the plurality of decoding transistors may be a high voltage transistor. In addition, an address ADD may be provided to the decoding and precharging unit 210. For example, the address ADD may be provided to gates of the plurality of decoding transistors.

The plurality of decoding transistors may form a transmission path for transmitting a block selection voltage VBS to the block word line BLKWL. For example, when the address ADD has a bit value for selecting a corresponding cell block, all of the decoding transistors may be turned on so that the transmission path of the block selection voltage VBS via the decoding transistors may be formed. Accordingly, when the cell block is selected, the block word line BLKWL may be precharged by the block selection voltage VBS. When the corresponding cell block is non-selected, at least one of the plurality of decoding transistors may be turned off so that the transmission path of the block selection voltage VBS may be blocked.

In addition, the block selection voltage VBS which is applied to the block word line BLKWL may be provided to the pass transistor block 220. As described in the above exemplary embodiment of the inventive concept, the pass transistor block 220 may include a plurality of pass transistors for controlling various row driving voltages Vssl, Vwl, and Vgsl to be provided to the row lines SSL, WLs, and GSL of the memory cell array 110. Vssl may be a string selection voltage, Vwl may be a word line voltage and Vgsl may be a ground selection voltage. A gate of each of the plurality of pass transistors may be applied with the block selection voltage VBS, and each of the plurality of pass transistors may be turned on or off according to a level of the block selection voltage VBS.

As illustrated in FIG. 3, since the decoding and precharging unit 210 switches the high voltage VPP without using a high voltage PMOS transistor, the high voltage PMOS transistor having a large size does not have to be included in the row decoder 220. Thus, a size of the row decoder 200 may be decreased. In addition, in a memory device, even if cell blocks are arranged in a one-to-one correspondence with such row decoders, instead of sharing two or more cell blocks with a single row decoder, the overall size of the memory device may remain the same. Accordingly, a sharing structure of the cell block is not needed, and thus, driving of the memory device may become efficient and the performance of the memory device may be increased.

Figure 4:
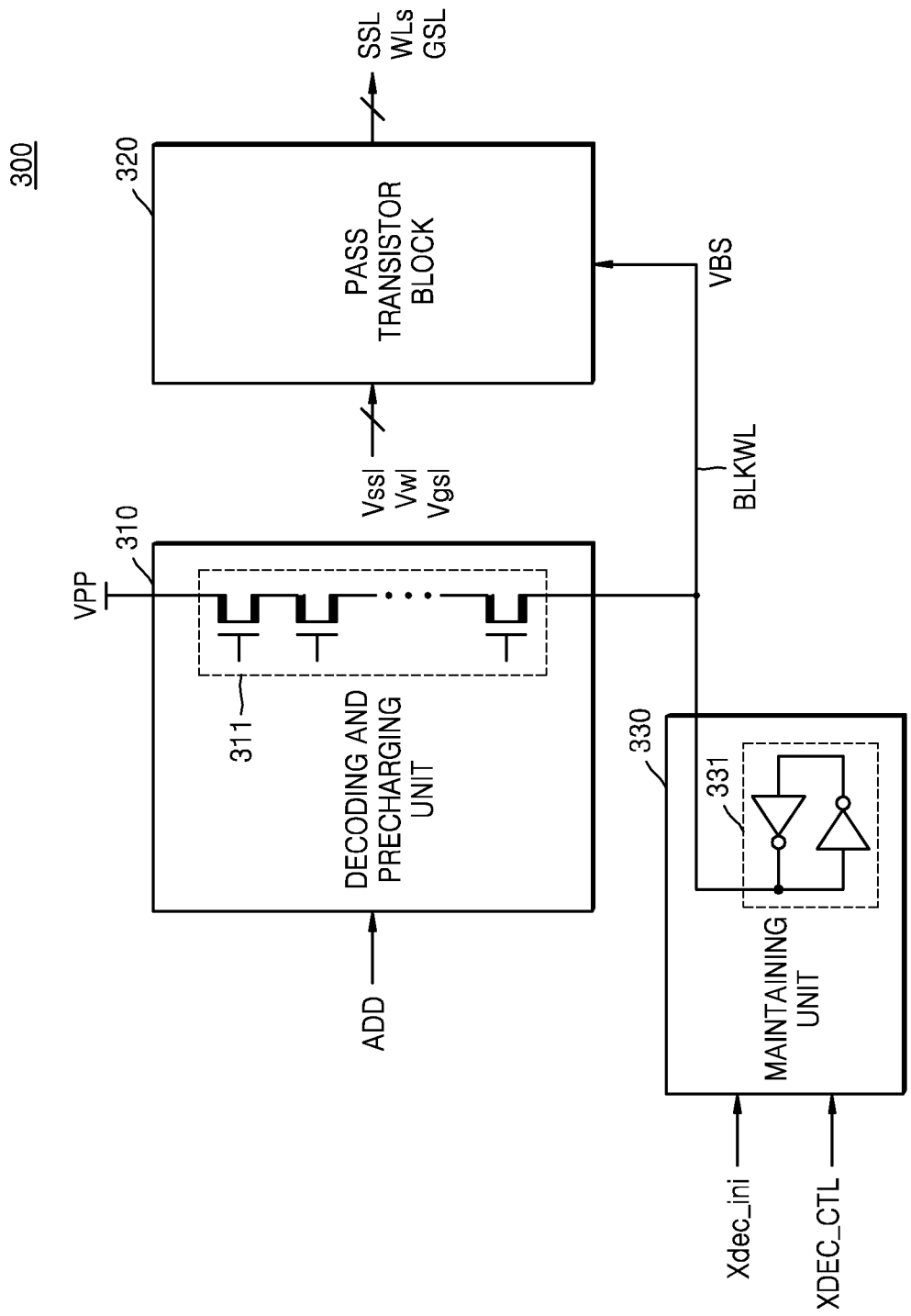
FIG. 4 is a block diagram of a row decoder according to an exemplary embodiment of the inventive concept.

FIG. 4 is a block diagram of a row decoder 300 according to an exemplary embodiment of the inventive concept. For convenience of explanation, FIG. 4 illustrates components of the row decoder 300 that are related to a selection of a cell bock. For example, the components illustrated in FIG. 4 may be included in the block selection unit 125 of FIG. 2. In addition, descriptions of the components of FIG. 4 that are the same as or similar to the components of FIG. 3 may be omitted.

Referring to FIG. 4, the row decoder 300 may include a decoding and precharging unit 310, a pass transistor block 220, and a maintaining unit 330. The decoding and precharging unit 310 may include a high voltage transistor area 311 arranged between the high voltage VPP and the block word line BLKWL, and the high voltage transistor area 311 may include a plurality of decoding transistors connected in series. In addition, the pass transistor block 320 may include a plurality of pass transistors that are switched in response to the block selection voltage VBS to drive the row lines SSL, WLs, and GSL. In addition, the maintaining unit 330 may maintain a level of the block selection voltage VBS applied to the block word line BLKWL. For example, the maintaining unit 330 may include a latch 331 connected to a node of the block word line BLKWL.

The maintaining unit 330 may receive an initialization signal Xdec_ini and a row control signal XDEC_CTL, and may operate in response to these signals. For example, the maintaining unit 330 may initialize a voltage level applied to the block word line BLKWL, in response to the initialization signal Xdec_ini. In addition, the maintaining unit 330 may perform an operation of maintaining a level of the block selection voltage VBS, in response to a row control signal XDEC_CTL. For example, the maintaining unit 330 may electrically connect the latch 331 and a node of the block word line BLKWL, in response to the row control signal XDEC_CTL.

Figure 5:
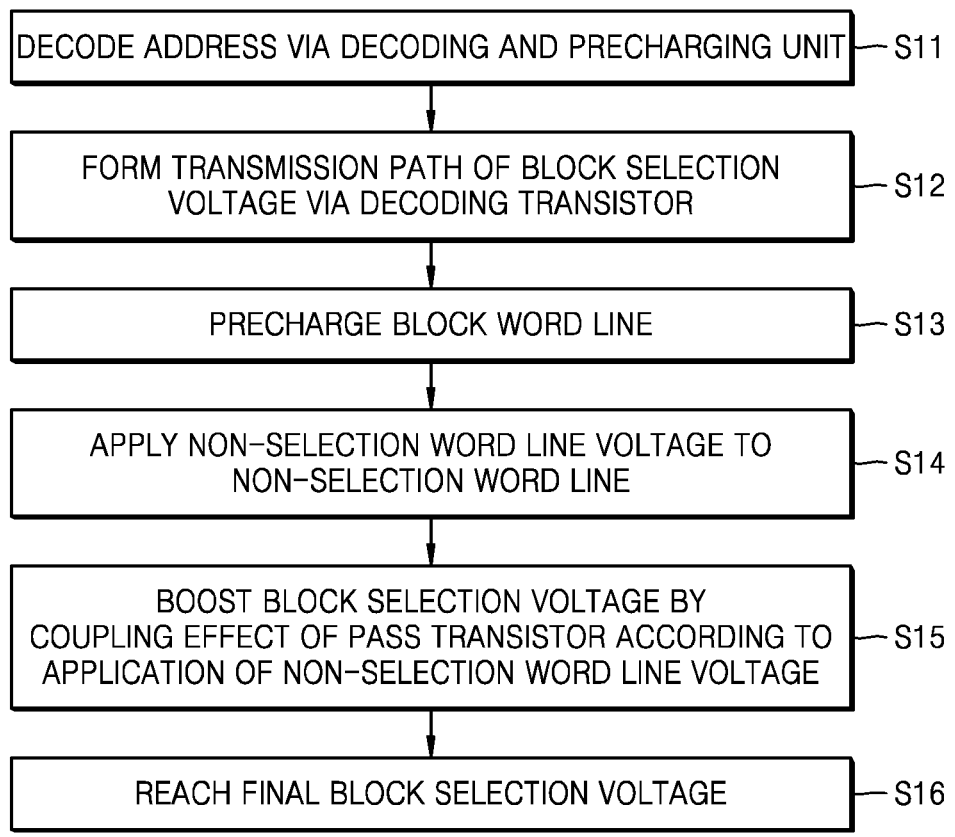
FIG. 5 is a flowchart of an operation method of a memory device according to an exemplary embodiment of the inventive concept.

FIG. 5 is a flowchart of an operation method of a memory device according to an exemplary embodiment of the inventive concept. The example of the operation of the memory device will be described by referring to FIGS. 4 and 5.

When memory operations, such as a program operation, a read operation, and an erase operation, are requested, the memory device receives a command and an address. The address may include a row address and a column address, and at least some bits of the row address may be a block address related to a selection operation of a plurality of cell blocks included in a memory cell array.

First, the decoding and precharging unit 310 included in the row decoder 300 may decode an address in operation S11. As an example of the decoding operation, a plurality of decoding transistors may be changed to a switching state corresponding to a bit value of the address. When a corresponding cell block is selected, all of the plurality of decoding transistors may be changed to a turned-on state according to a result of decoding the address.

The plurality of decoding transistors may be used as a transmission path of the block selection voltage VBS for selecting a corresponding cell block. When the corresponding cell block is selected, a transmission path of the block selection voltage VBS via the decoding transistors is formed in operation S12.

The block selection voltage VBS may be generated from a high voltage VPP provided from the outside of the memory device or generated inside the memory device. For example, the high voltage VPP may be provided to the block word line BLKWL, as the block selection voltage VBS, via the plurality of decoding transistors, and thus, the block word line BLKWL may be precharged by the block selection voltage VBS, in operation S13. For example, since the high voltage VPP is provided to the block word line BLKWL in a state in which a voltage level of the high voltage VPP is reduced by the plurality of decoding transistors, the block word line BLKWL may be precharged by a voltage that is lower than the high voltage VPP by a predetermined level. For example, the predetermined level may be a level corresponding to a threshold voltage of at least one high voltage transistor.

The block selection voltage VBS applied to the block word line BLKWL may be provided to gates of the plurality of pass transistors, and the pass transistors for electrically connecting row driving voltages Vssl, Vwl, and Vgsl and row lines SSL, WLs, and GSL may be turned on. For example, referring to a case where the block selection voltage VBS is boosted by a non-selection word line voltage, a non-selection word line voltage is applied to a non-selection word line of the row lines SSL, WLs, and GSL, in operation S14. In addition, when the non-selection word line voltage is applied, the block selection voltage VBS is boosted due to a coupling effect of the pass transistor in operation S15, and thus, a voltage level of the block selection voltage VBS is increased. In addition, the level of the block selection voltage VBS may reach a final block selection voltage in operation S16.

Figure 6:
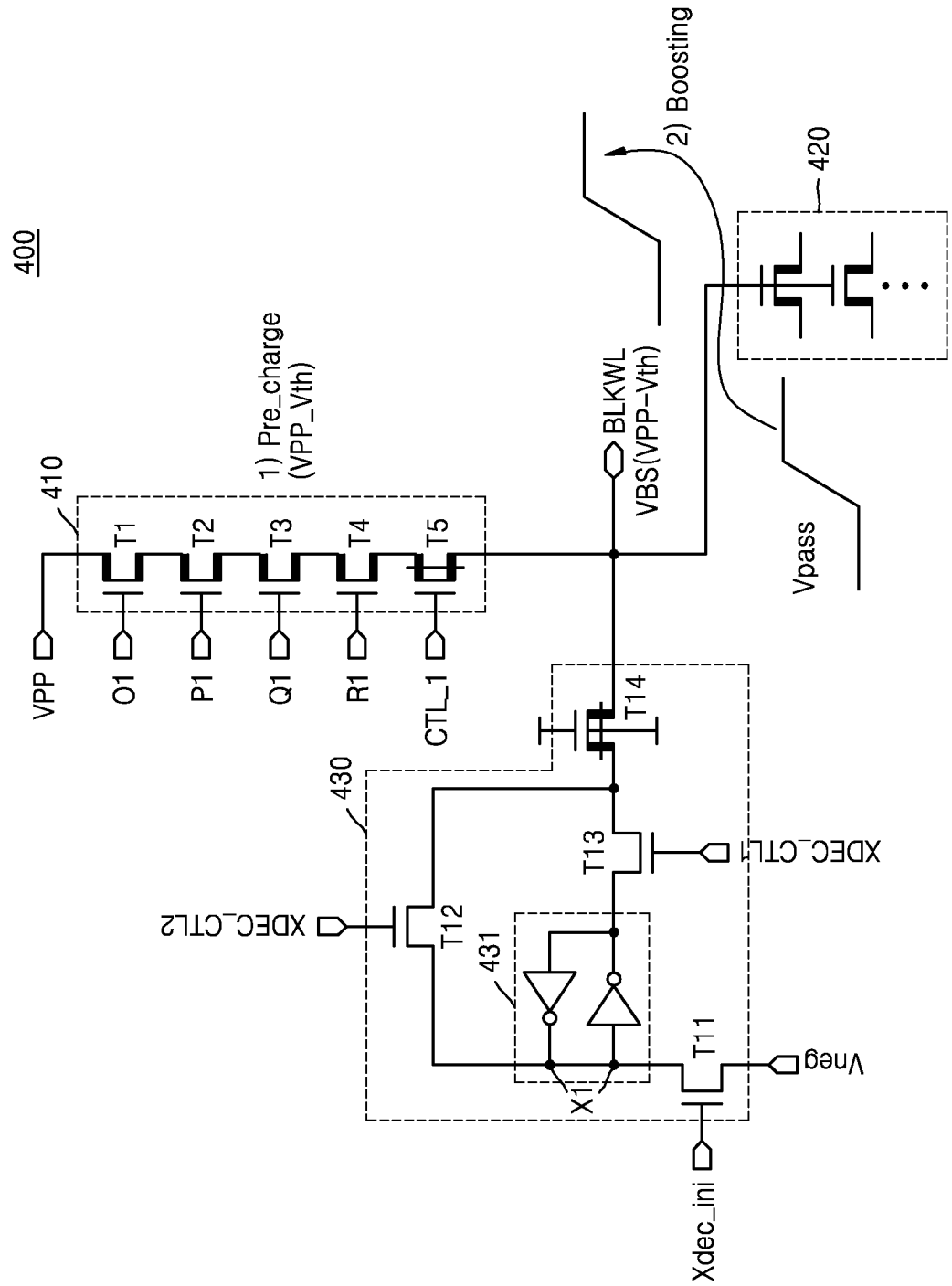
FIG. 6 is a circuit diagram of a row decoder of FIG. 1 according to an exemplary embodiment of the inventive concept.

FIG. 6 is a circuit diagram of a row decoder 120 of FIG. 1 according to an exemplary embodiment of the present inventive concept. As illustrated in FIG. 6, row decoder 400 may include a decoding and precharging unit 410, a pass transistor block 420, and a maintaining unit 430.

The decoding and precharging unit 410 may include a high voltage transistor area including a plurality of decoding transistors T1 to T4, as described above. For example, the decoding and precharging unit 410 may include the plurality of decoding transistors T1 to T4 connected in series between the high voltage VPP and the block word line BLKWL and receiving addresses O1, P1, Q1, and R1, respectively. The addresses O1, P1, Q1, and R1 may be addresses having information related to a block selection, from among addresses provided to the memory device. In addition, for example, the high voltage transistor area may further include a first high voltage depletion mode transistor T5 arranged between the plurality of decoding transistors T1 to T4 and the block word line BLKWL. Each of the decoding transistors T1 to T4 and the first high voltage depletion mode transistor T5 may be a high voltage n-type metal oxide semiconductor (NMOS) transistor.

In addition, similar to the above-described exemplary embodiment of the inventive concept, the block word line BLKWL may be commonly connected to a gate of the plurality of pass transistors included in the pass transistor block 420. Each of the decoding and precharging unit 410 and the pass transistor block 420 may operate in a high voltage area. In addition, each of the plurality of pass transistors may be a high voltage NMOS transistor.

In addition, the maintaining unit 430 may be connected to the block word line BLKWL via one or more transistors T12 and T13. In addition, a second high voltage depletion mode transistor T14 may be connected between a latch 431 and the block word line BLKWL so that the maintaining unit 430 operates in a low voltage area. In addition, the maintaining unit 430 may further include an initialization switch T11 that is switched in response to an initialization signal Xdec_ini to initialize a voltage level of the block word line BLKWL. The initialization switch T11 may be connected to a low voltage (for example, a ground voltage Vneg), and may be switched in response to the initialization signal Xdec_ini to electrically connect the low voltage Vneg and the block word line BLKWL.

Figure 7:
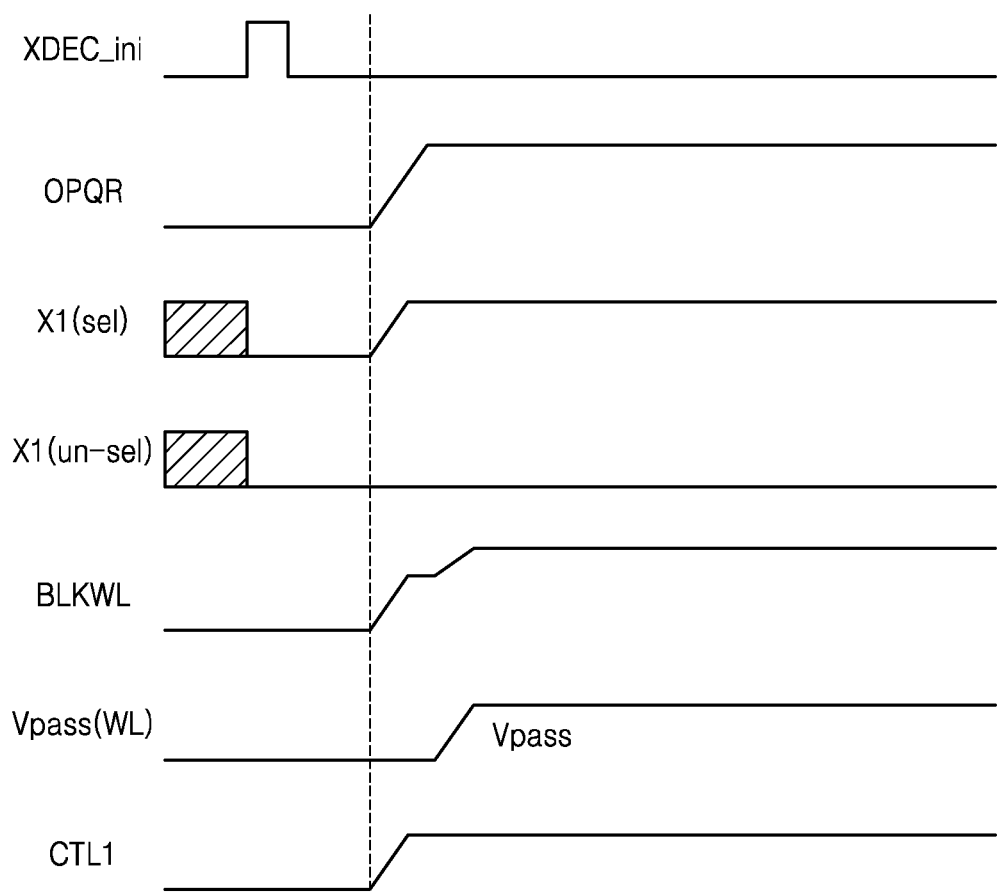
FIG. 7 is a waveform diagram of an operation of the row decoder of FIG. 6 according to an exemplary embodiment of the inventive concept.

An example of an operation of the row decoder 400 of FIG. 6 will be described by referring to FIG. 7. FIG. 7 is a waveform diagram of the operation of the row decoder 400 of FIG. 6 according to an exemplary embodiment of the inventive concept.

First, when the initialization signal Xdec_ini is activated, the voltage level of the block word line BLKWL is initialized. Then, since an address OPQR related to a bank selection has a logic high level, each of the plurality of decoding transistors T1 to T4 is turned on. In addition, a control signal CTL_1 is changed to a logic high state, and thus, the first high voltage depletion mode transistor T5 may also be turned on.

When the decoding transistors T1 to T4 and the first high voltage depletion mode transistor T5 are turned on, a transmission path of the block selection voltage VBS is formed. The high voltage VPP has a drop of voltage of a predetermined level by passing through the decoding transistors T1 to T4, and thus, the block selection voltage VBS applied to the block word line BLKWL may have a lower level (for example, VPP−Vth) than the high voltage VPP. Accordingly, the block word line BLKWL may be precharged by a level corresponding to VPP−Vth.

When a voltage of the block word line BLKWL is increased, high voltage transistors of the pass transistor block 420 are turned on, and various voltages for memory operations, such as a program operation and an erase operation, are provided to row lines SSL, WLs, and GSL. For example, in the case of a program operation, a program voltage may be applied to a selection word line, and a pass voltage Vpass may be applied to a non-selection word line. When the high voltage transistors of the pass transistor block 420 are turned on, each of the high voltage transistors may have a capacitance element, and when voltage levels of the row lines SSL, WLs, and GSL are changed due to the program voltage or the pass voltage Vpass, the block selection voltage VBS may be boosted and may have the higher voltage level.

In addition, when a corresponding cell block is selected, the connection transistors T12 and T13 included in the maintaining unit 430 are turned on, and thus, the latch 431 may be electrically connected to a node of the block word line BLKWL so that a voltage level applied to a node X1 of the latch 431 may be increased. When the corresponding cell block is non-selected, an initial ground voltage of the node X1 is maintained so that the block word line BLKWL may also be maintained as the ground voltage state. Accordingly, the corresponding cell block may maintain a non-selection state.

The row decoder 400 according to the present exemplary embodiment does not include the high voltage PMOS transistor having a large size, and thus, an overall size of the row decoder 400 may be decreased. In addition, since the decoding transistors T1 to T4 perform both the function of decoding an address for selecting a cell block and the function of precharging the block word line BLKWL, the structure of the row decoder 400 may be simplified.

Figure 8:
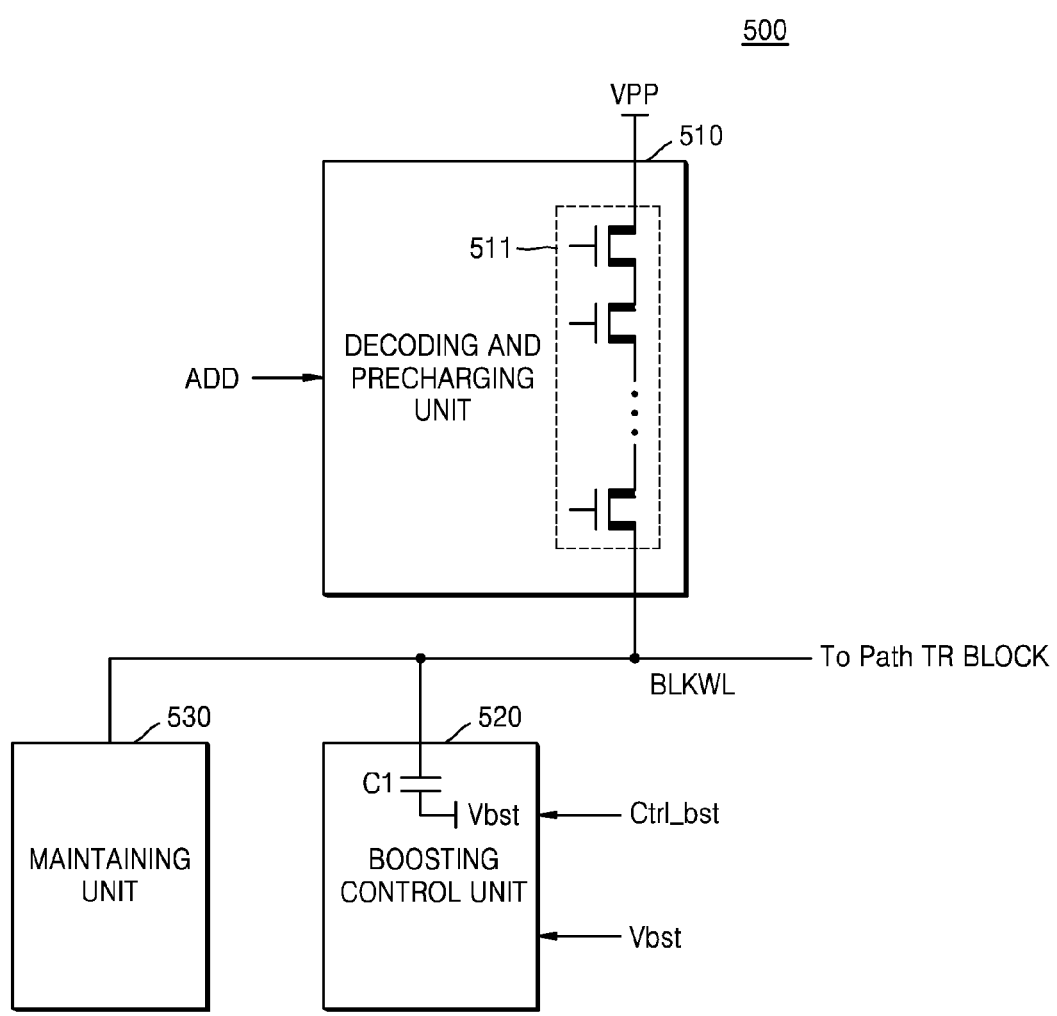
FIG. 8 is a block diagram of a row decoder according to an exemplary embodiment of the inventive concept.

FIG. 8 is a block diagram of a row decoder 500 according to an exemplary embodiment of the inventive concept. Descriptions of components of FIG. 8 that are the same as or similar to the components of FIGS. 3 and 4 may be omitted.

Referring to FIG. 8, the row decoder 500 may include a decoding and precharging unit 510, a boosting control unit 520, and a maintaining unit 530. The decoding and precharging unit 510 may include a high voltage transistor area 511 arranged between the high voltage VPP and the block word line BLKWL, and the high voltage transistor area 511 may include a plurality of decoding transistors connected in series. The plurality of decoding transistors 510 may decode the address ADD and form a transmission path of a block selection voltage for precharging the block word line BLKWL. The block selection voltage may be provided to pass transistors for driving row lines. In addition, the maintaining unit 330 may be connected to a node of the block word line BLKWL and maintain a voltage level of the block word line BLKWL.

In addition, according to an exemplary embodiment of the inventive concept, boosting of the block selection voltage may be performed by the boosting control unit 520. For example, the boosting control unit 520 may receive a boosting voltage Vbst and a boosting control signal Ctrl_bst. After the block word line BLKWL is precharged, the boosting control unit 520 may change a voltage level of one node of a capacitor C1 to the boosting voltage Vbst, in response to the boosting control signal Ctrl_bst, and the block selection voltage of the block word line BLKWL may increase its level in response to the changed voltage level of the node of the capacitor C1.

According to an exemplary embodiment of the inventive concept, even if the block selection voltage of the block word line BLKWL is decreased by a predetermined level from the high voltage VPP, the block selection voltage may be boosted by various methods so that the block selection voltage may maintain a sufficiently high level. In other words, exemplary embodiments of the inventive concept are not limited to using the pass transistor to boost the block selection voltage, and various designs may be used.

Figure 9:
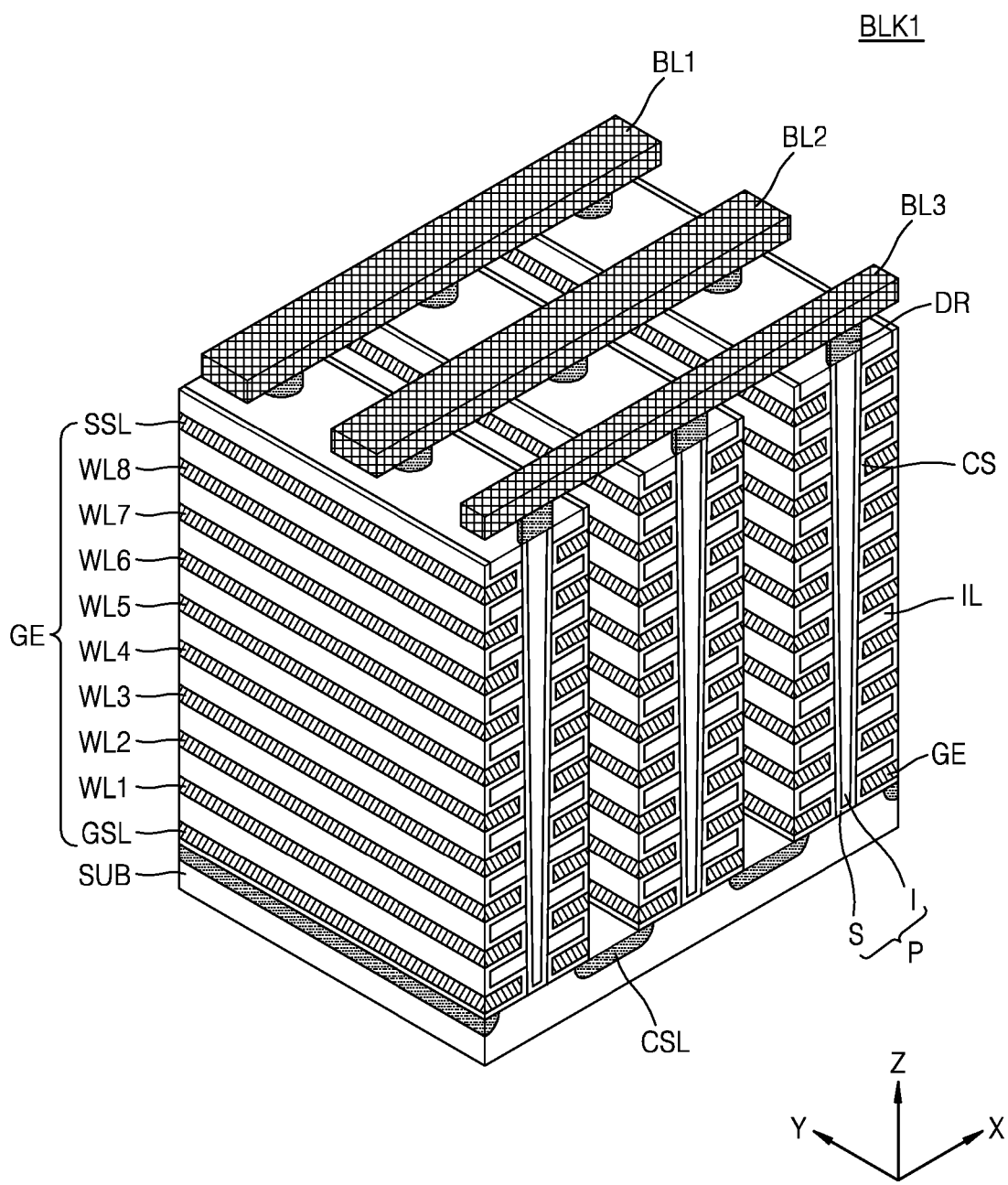
FIG. 9 is a structural view of a memory cell array of FIG. 1 according to an exemplary embodiment of the inventive concept.

FIG. 9 is a structural view of the memory cell array 110 of FIG. 1 according to an exemplary embodiment of the inventive concept.

The memory cell array 110 may include a plurality of cell blocks, and each of the plurality of cell blocks may have a three-dimensional structure (or a vertical structure). For example, each cell block includes structures extending in first to third directions. For example, in the case of a flash memory device, each cell block may include a plurality of NAND strings extending in the third direction. Here, the plurality of NAND strings may be disposed apart from one another by a predetermined distance, in the first and second directions. FIG. 9 illustrates the structural view of a cell block BLK1.

Referring to FIG. 9, the cell block BLK1 is formed in a vertical direction with respect to a substrate SUB. In FIG. 9, it is illustrated that the cell block BLK1 includes two selection lines GSL and SSL, eight word lines WL1 to WL8, and three bit lines BL1 to BL3. However, the number of selection lines, word lines, and bit lines may vary.

The substrate SUB has a first conductive type (for example, a p type), and a common source line CSL extends on the substrate SUB in a first direction (for example, a direction of Y) and is doped with impurities of a second conductive type (for example, an n type). A plurality of insulating layers IL extending in the first direction are sequentially provided in a third direction (for example, a direction of Z), on an area of the substrate SUB between two adjacent common source lines CSL. Further, the plurality of insulating layers IL are apart from one another by a predetermined distance in the third direction. For example, the plurality of insulating layers IL may include an insulating material, such as silicon oxide.

A plurality of pillars P are sequentially arranged in the first direction, on the area of the substrate SUB between two adjacent common source lines CSL, and the plurality of pillars P penetrate the plurality of insulating layers IL in the third direction. For example, the plurality of pillars P may contact the substrate SUB by penetrating the plurality of insulating layers IL. For example, a surface layer S of each pillar P may include a silicon material having a first type, and may function as a channel area. In addition, an internal layer I of each pillar P may include an insulating material such as silicon oxide, or an air gap.

A charge storage layer CS is provided in an area between two adjacent common source lines CSL, along exposed surfaces of the insulating layers IL, the pillars P, and the substrate SUB. The charge storage layer CS may include a gate insulating layer (also referred to as a "tunneling insulating layer"), a charge trap layer, and a blocking insulating layer. For example, the charge storage layer CS may have an oxide-nitride-oxide (ONO) structure. In addition, a gate electrode GE, such as the selection lines GSL and SSL and the word lines WL1 to WL8, is provided on the exposed surface of the charge storage layer CS, in the area between two adjacent common source lines CSL.

Drains or drain contacts DR are provided on the plurality of pillars P. For example, the drains or the drain contacts DR may include a silicon material doped with impurities having a second conductive type. Bit lines BL1 to BL3 extending in a second direction (for example, a direction of X) and arranged apart from one another by a predetermined distance in the first direction are provided on the drains DR.

The following patent documents, which are herein incorporated by reference in their entireties, describe configurations of a three-dimensional (3D) memory array, which includes a plurality of levels, and in which word lines and/or bit lines are shared by the plurality of levels: U.S. Pat. Nos. 7,679,133, 8,553,466, 8,654,587, 8,559,235, and U.S. Patent Application Publication No. 2011/0233648.

Figure 10:
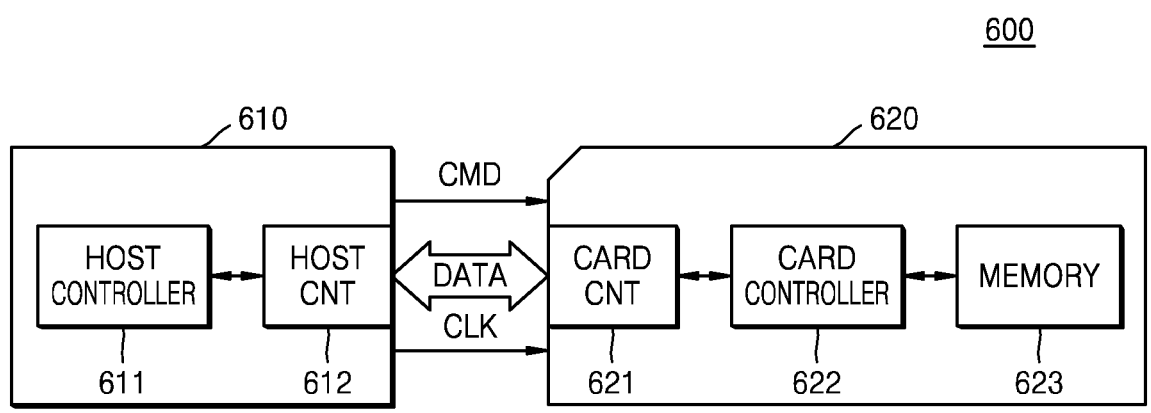
FIG. 10 is a block diagram of a memory device according to an exemplary embodiment of the inventive concept being applied to a memory card system.

FIG. 10 is a block diagram of a memory device according to an exemplary embodiment of the inventive concept being applied to a memory card system 600. For example, the memory device may be a flash memory device.

Referring to FIG. 10, the memory card system 600 may include a host 610 and a memory card 620. The host 610 may include a host controller 611 and a host contact unit 620. The memory card 620 may include a card contact unit 621, a card controller 622, and a memory device 623. Here, the memory device 623 may be realized by using any one of the exemplary embodiments of FIGS. 1 through 9. Accordingly, the memory device 623 may include a flash memory device. In addition, according to an exemplary embodiment of the inventive concept, the memory device 623 may include a memory cell array having a plurality of cell blocks and a row decoder for driving a row of the memory cell array. In addition, the row decoder may include a plurality of decoding transistors for decoding an address for selecting a bank, and the plurality of decoding transistors may be used as a path for transmitting a block selection voltage. In addition, a high voltage PMOS transistor is not arranged in the row decoder, and thus, the row decoder may have a reduced size.

The host 610 may write data to the memory card 620 or read data stored in the memory card 620. The host controller 611 may transmit a clock signal CLK generated in a clock generator in the host 610 and to the memory card 620 via the host contact unit 612. The host 610 may also transmit a command CMD to the memory card 620.

In response to a request received via the card contact unit 621, the card controller 622 may provide data to the memory system 623 by synchronizing the data with a clock signal generated in a clock generator in the card controller 622. The memory device 623 may store data transmitted from the host 610.

The memory card 620 may be, for example, as a compact flash card (CFC), a microdrive, a smart media card (SMC), a multimedia card (MMC), a secure digital card (SDC), a universal flash storage (UFS) device, a memory stick, and a universal serial bus (USB) flash memory driver.

Figure 11:
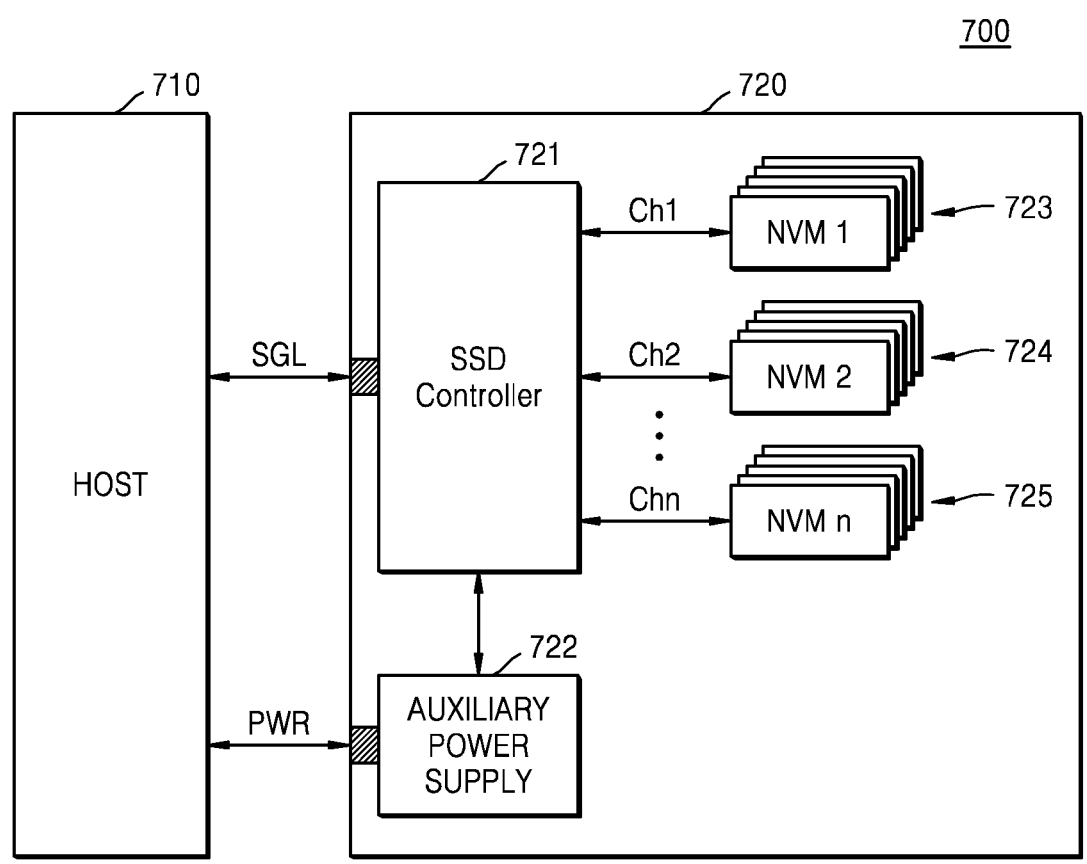
FIG. 11 is a block diagram of a memory device according to an exemplary embodiment of the inventive concept being applied to a solid state drive (SSD) system.

FIG. 11 is a block diagram of a memory device according to an exemplary embodiment of the inventive concept being applied to a solid state drive (SSD) system 700.

Referring to FIG. 11, the SSD system 700 may include a host 710 and an SSD 720. The SSD 720 may exchange signals SGL with the host 710 via a signal connector, and may receive power PWR via a power connector. The SSD 720 may include an SSD controller 721, an auxiliary power supply 722, and a plurality of non-volatile memory devices 723, 724, . . . 72n connected via channels Ch1 to Chn. Each of the plurality of non-volatile memory devices 723, 724, . . . 725 may include a memory device according to an exemplary embodiment of the inventive concept. According to the present exemplary embodiment, each of the non-volatile memory systems 723, 724, . . . 725 may include a memory cell array having a plurality of cell blocks, and a row decoder for driving a row of the memory cell array. In addition, a high voltage PMOS transistor is not arranged in the row decoder, and thus, the row decoder may have a small size.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A row decoder of a semiconductor memory device, the row decoder comprising:
   a decoding and precharging unit that is connected between a high voltage node and a block word line, wherein the decoding and precharging unit precharges the block word line with a block selection voltage, wherein the decoding and precharging unit comprises a plurality of serially connected decoding transistors that are turned-on in response to a plurality of addresses corresponding to the plurality of decoding transistors to form a transmission path for providing the block word line with the block selection voltage; and
   a pass transistor block that transmits one or more row driving voltages to row lines in response to the block selection voltage,
   wherein the block selection voltage is boosted according to a switching operation of the pass transistor block.

2. The row decoder of claim 1, wherein the plurality of decoding transistors are turned on in response to an address indicating a selection of a cell block.

3. The row decoder of claim 1, wherein at least one of the plurality of decoding transistors comprises a high voltage n-type metal oxide semiconductor (NMOS) transistor.

4. The row decoder of claim 1, wherein the pass transistor block comprises one or more pass transistors that are switched in response to the block selection voltage.

5. The row decoder of claim 1, wherein the one or more row driving voltages comprise at least one of a string selection voltage, a word line voltage, and a ground selection voltage, and
   the block selection voltage is boosted according to an increase or a decrease of at least one of the string selection voltage, the word line voltage, and the ground selection voltage.

6. The row decoder of claim 1, wherein the plurality of decoding transistors comprise first to $N^{th}$ decoding transistors connected in series between the high voltage node and the block word line, where N is an integer equal to or greater than 2, and
   N bits of an address are provided to gates of the first to $N^{th}$ decoding transistors, wherein the address is related to a selection of a cell block.

7. The row decoder of claim 6, wherein the decoding and precharging unit further comprises a high voltage depletion mode transistor, which is connected between the $N^{th}$ decoding transistor and the block word line.

8. The row decoder of claim 1, further comprising a maintaining unit comprising a latch connected to the block word line, wherein the maintaining unit comprises a high voltage transistor connected between the latch and the block word line.

9. The row decoder of claim 1, wherein the decoding and precharging unit does not use a high voltage p-type metal oxide semiconductor (PMOS) transistor to precharge the block word line.

10. The row decoder of claim 1, wherein the decoding and precharging unit transmits the voltage of the high voltage node after it passes through the entire transmission path as the block selection voltage.

11. A row decoder, comprising:
    a first circuit including a plurality of transistors disposed between a high voltage node and a block word line, wherein the plurality of transistors decode an address and form a path for a block selection voltage; and
    a second circuit connected to the first circuit via the block word line, wherein the second circuit transmits at least one row driving voltage in response to the block selection voltage,
    wherein a high voltage provided to the high voltage node has a drop of a voltage of a first level by passing through the plurality of transistors,
    wherein the high voltage dropped by the voltage of the first level precharges the block word line.

12. The row decoder of claim 11, wherein the plurality of transistors are connected in series between the high voltage node and the block word line.

13. The row decoder of claim 11, wherein the block selection voltage is increased when transistors of the second circuit are turned on to provide the row driving voltages.

14. A row decoder of a semiconductor memory device, the row decoder comprising:
- a decoding and precharging unit that is connected between a high voltage node and a block word line, wherein the decoding and precharging unit precharges the block word line, and wherein the decoding and precharging unit comprises a plurality of decoding transistors that decode an address and form a transmission path for transmitting a block selection voltage; and
- a pass transistor block that transmits one or more row driving voltages to row lines in response to the block selection voltage,
- wherein the block selection voltage is boosted according to a switching operation of the pass transistor block,
- wherein a high voltage provided to the high voltage node has a drop of a voltage of a first level by passing through the plurality of decoding transistors,
- wherein the high voltage dropped by the voltage of the first level precharges the block word line.

* * * * *